United States Patent
Cassarino et al.

(10) Patent No.: US 10,615,732 B2
(45) Date of Patent: Apr. 7, 2020

(54) METHOD FOR PULSE WIDTH MODULATION

(71) Applicant: Commissariat a l'energie atomique et aux energies alternatives, Paris (FR)

(72) Inventors: Leandro Cassarino, Talence (FR); Ghislain Despesse, Voreppe (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/233,327

(22) Filed: Dec. 27, 2018

(65) Prior Publication Data
US 2019/0199266 A1    Jun. 27, 2019

(30) Foreign Application Priority Data
Dec. 27, 2017 (FR) ...................... 17 63276

(51) Int. Cl.
*H02P 27/08* (2006.01)
*H02M 7/483* (2007.01)
(Continued)

(52) U.S. Cl.
CPC ............ *H02P 27/08* (2013.01); *H02M 7/483* (2013.01); *H03K 7/08* (2013.01); *H02M 7/5395* (2013.01)

(58) Field of Classification Search
CPC ... G05B 11/28; H02P 1/00; H02P 1/04; H02P 1/46; H02P 3/00; H02P 3/18; H02P 3/24;
(Continued)

(56) References Cited

U.S. PATENT DOCUMENTS

| 4,348,734 A | 9/1982 | Dougherty |
| 4,683,409 A * | 7/1987 | Boillat ...................... H02P 8/18 |
| | | 318/685 |

(Continued)

FOREIGN PATENT DOCUMENTS

| EP | 0 745 951 A2 | 12/1996 |
| GB | 2 080 060 A | 1/1982 |

OTHER PUBLICATIONS

Wikipedia, Pulse-Width Modulation, Apr. 2009, Wikimedia Foundation, Inc, pp. 1-10 (Year: 2009).*

(Continued)

*Primary Examiner* — Antony M Paul
(74) *Attorney, Agent, or Firm* — Oblon, McClelland, Maier & Neustadt, L.L.P.

(57) ABSTRACT

The invention is a method for generating a control signal ($S_c$) by pulse modulation according to a reference signal ($S_{ref}$), the method comprising forming successive modulation sequences, each sequence comprising a transition between a low state and a high state or vice versa, the method comprising the following iterative steps, each iteration being associated with an instant, referred to as the current instant:

a) calculating a time derivative ($S'_{ref}(t)$) of the reference signal at the current instant (t);

b) according to the derivative of the reference signal ($S'_{ref}(t)$), selecting,
when the derivative is positive, a sequence (M(t)) comprising a high state preceded by a low state, the high state extending up to the end of the modulation sequence;
when the derivative is negative, a sequence (M(t)), comprising a high state followed by a low state, the low state extending up to the end of the modulation sequence;

(Continued)

the low state and the high state extending over a low state duration ($T_{low}(t)$) and a high state duration ($T_{high}(t)$) respectively, the selected sequence (M(t)), associated with the current instant (t), extending over a sequence duration (T(t)) starting from the current instant (t);

c) determining a high level (high(t) and a low level (low(t)), the high level being strictly greater than the low level, d) according to the amplitude of the reference signal ($S_{ref}$) during the sequence duration (T(t)), determining the duration of the high state ($T_{high}(t)$) or the duration of the low state ($T_{low}(t)$) of the sequence;

e) reiterating steps a) to e), by incrementing the current instant or stopping the iterations.

10 Claims, 6 Drawing Sheets

(51) Int. Cl.
*H03K 7/08* (2006.01)
*H02M 7/5395* (2006.01)

(58) Field of Classification Search
CPC .......... H02P 21/00; H02P 23/00; H02P 25/00; H02P 27/00; H02P 27/04; H02P 27/06
USPC ......... 318/599, 811, 400.01, 400.02, 400.14, 318/700, 701, 721, 779, 799, 800, 801, 318/430, 490, 504; 388/800, 811, 819, 388/831, 910
See application file for complete search history.

(56) References Cited

U.S. PATENT DOCUMENTS

| | | | | |
|---|---|---|---|---|
| 5,734,152 | A * | 3/1998 | Goren | G06K 7/10851 235/462.27 |
| 2011/0133682 | A1* | 6/2011 | Egger | H02P 8/12 318/685 |
| 2017/0074168 | A1 | 3/2017 | Chai et al. | |

OTHER PUBLICATIONS

French Preliminary Search Report dated Nov. 9, 2018 in French Application 17 63276 filed on Dec. 27, 2017 (with English Translation of Categories of Cited Documents and Written Opinion).

* cited by examiner

METHOD FOR PULSE WIDTH MODULATION

TECHNICAL FIELD

The technical field of the invention is pulse width modulation for generating an electrical control signal, e.g. for the attention of a power circuit, in particular a motor.

PRIOR ART

Pulse width modulation, often referred to by the abbreviation PWM, consists in generating square pulses in a duty cycle for forming a control signal, making it possible, for example, to control a power circuit. The power circuit may be a synchronous or an asynchronous motor. It generally comprises an inductive low-pass filter, so that the modulation of the duty cycle, after filtering, allows the formation of a continuous signal, the amplitude of which depends on the duty cycle. Thus, a variable frequency and amplitude signal is obtained.

Pulse width modulation is commonly used for controlling voltage inverters intended for controlling three-phase motors. Most PWM pulse generators generate pulses at a set frequency, the duty cycle of the pulses being determined according to the value of a reference signal, so as to obtain the desired control signal. When the reference signal is a periodic signal, the pulse frequency is markedly higher than the frequency of the reference signal, so as to obtain a control signal, representative of the reference signal, formed by averaging the value of the pulses over a few periods.

EP0336019 describes a multilevel pulse width modulation method, according to which the pulse formed may take three discrete voltage levels according to the reference signal. This results in the formation of a pulse control signal switching between the different levels, according to a frequency, known as a chopping frequency, set and determined arbitrarily, the duty cycle between the different levels being modulated. The chopping frequency corresponds, for example, to the frequency between two rising edges or two falling edges of the formed control signal. This poses a difficulty, since the chopping frequency is generally dimensioned according to conservative assumptions, which leads to a high number of switchings.

Another drawback is that the switching instants are not controlled and are only determined by a comparison between the reference signal and a wave, referred to as a triangular carrier wave. These switching instants are not optimized.

Another difficulty is that the duration of a pulse, i.e. the duration in which the control signal takes the same value, is random. In particular, the duration of a pulse may be very short, which is not optimal. Indeed, the transition between two voltage levels is not immediate. When the duration of a pulse is too short, the duration of transition becomes significant with respect to the duration of the pulse, which leads to significant losses of transmitted energy. Indeed, each switching leads to a loss of energy. The more numerous and close to each other the switchings are, the greater the dissipated power, while having little effect on the quality of the filtered control signal.

The inventors have provided a modulation method overcoming these difficulties. They provide a method for improving the quality of modulation, so as to form a control signal which, after applying a low-pass filter, is more representative of the reference signal, while optimizing the number of switchings, thus reducing energy losses. Moreover, another advantage of the method is an implementation that is inexpensive in memory, in particular for periodic signals.

DISCLOSURE OF THE INVENTION

A first object of the invention is a method for generating a control signal by pulse modulation according to a reference signal, the method comprising forming successive modulation sequences, each sequence comprising a transition between a low state and a high state or vice versa, the method comprising the following iterations, each iteration being associated with a current instant:
  a) calculating a time derivative of the reference signal, the time derivative being associated with a current modulation sequence corresponding to the current instant;
  b) according to the time derivative of the reference signal calculated in a), defining the current sequence, such that:
  when the derivative is positive, the current sequence comprises a high state preceded by a low state, the high state extending up to the end of the current sequence;
  when the derivative is negative, the current sequence comprises a high state followed by a low state, the low state extending up to the end of the current sequence;
  the low state and the high state extending over a low state duration and a high state duration respectively, the current sequence extending from the current instant, over a sequence duration;
  c) taking into account a high level, corresponding to the high state, and a low level, corresponding to the low state, the high level being strictly greater than the low level;
  d) according to the amplitude of the reference signal and the high and low levels taken into account in c), determining the duration of the high state or the duration of the low state of the current sequence defined in step b);
  e) reiterating steps a) to e), by incrementing the current instant by a duration equal to the duration of the sequence resulting from d), or stopping the iterations;
the method further comprising:
generating the control signal, according to the modulation sequences defined in steps
d) of the different iterations.
  d) may comprise taking into account a minimum duration, and:
  di) according to the sequence defined in b), and the amplitude of the reference signal during the sequence duration, calculating an additional duration, the additional duration corresponding to:
  the duration of the low state when the derivative of the reference signal is positive, the duration of the high state then being set to the minimum duration;
  the duration of the high state when the derivative of the reference signal is negative, the duration of the low state then being set to the minimum duration;
  dii) comparing the additional duration and the minimal duration;
  diii) when the additional duration is less than the minimum duration, invalidating the additional duration resulting from di), and determining an additional duration corresponding to:
  the duration of the high state, when the derivative of the reference signal is positive, the duration of the low state then being set to the minimum duration;

or the duration of the low state, when the derivative of the reference signal is negative, the duration of the high state then being set to the minimum duration.

In d), the additional duration may be calculated according to an integral of the reference signal during the sequence duration and the high level taken into account in c). The additional duration may be calculated so that the integral of the reference signal, reduced by the low level, during the sequence duration, is equal, within a predetermined tolerance, to the product of the high level, reduced by the low level, by the high state duration.

The method may comprise:

div) determining the presence of a stopping instant, corresponding to an instant characteristic of the reference signal or of its time derivative, during the current sequence;

dv) when a stopping instant is detected, cancelling the current sequence, and adjusting a preceding sequence, defined in a preceding iteration, so that the preceding sequence extends between a preceding instant and the stopping instant.

The preceding sequence may be adjusted so that:

when, at the preceding instant, the derivative of the reference signal is positive, the high state of the preceding sequence extends up to the stopping instant;

when at the preceding instant, the derivative of the reference signal is negative, the low state of the preceding sequence extends up to the stopping instant.

The stopping instant may correspond:

to an instant whereat the reference signal changes sign;

or to an instant whereat the derivative of the reference signal changes sign;

or the reference signal being periodic, to an instant corresponding to the end of a period of the reference signal;

or to an instant whereat the reference signal reaches the high level or the low level.

According to an embodiment, in b), the defined sequence comprises only one high state and only one low state.

According to an embodiment, in c), determining the high level and the low level is performed according to predetermined values, and according to the reference signal during the duration of the pulse.

Another object of the invention is a device for generating a control signal, according to a reference signal, the device comprising a processor capable of implementing a) to e) of a method according to the first object of the invention, according to the reference signal.

Other advantages and features will become more apparent from the following description of particular embodiments of the invention, given by way of non-restrictive examples and represented in the figures listed below.

FIGURES

DISCLOSURE OF PARTICULAR EMBODIMENTS

Figure 1A:
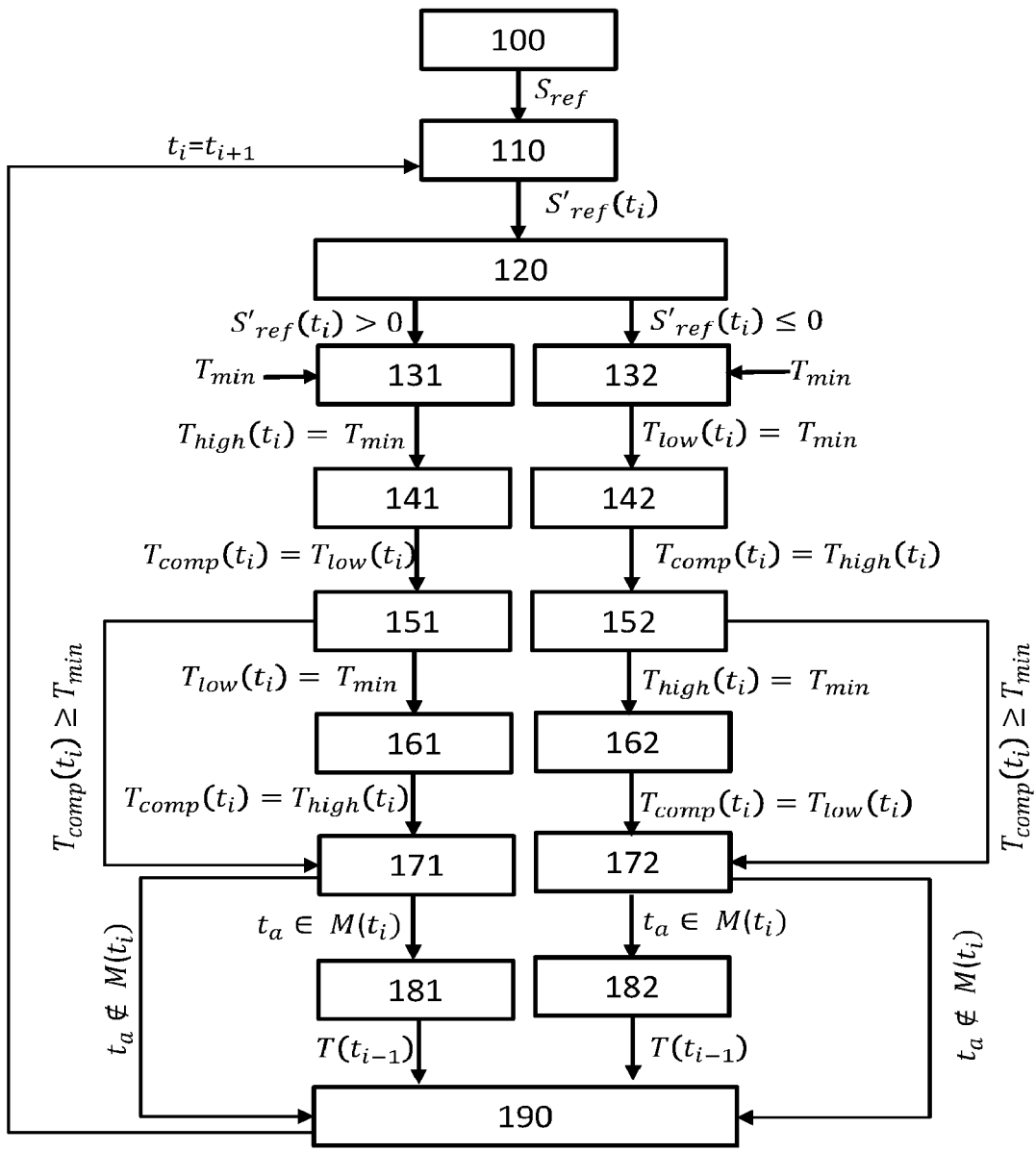
FIG. 1A represents the main steps of a method according to the invention.
Figure 1B:
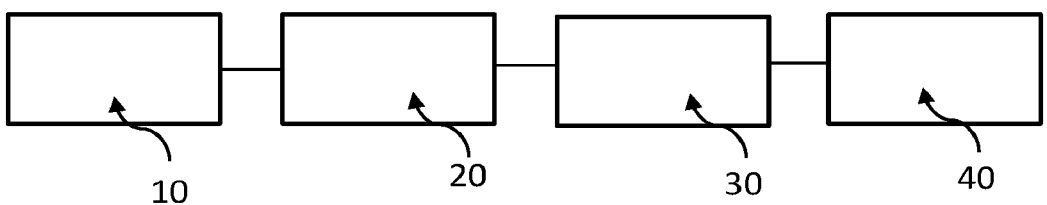
FIG. 1B is a diagram of the main components of a device for implementing the invention.

FIG. 1A depicts the main steps of an embodiment of the invention given as a non-restrictive example. FIG. 1B is a diagram of a device for implementing the embodiment described in connection with FIG. 1A. FIGS. 2A to 2F illustrate the modulation sequences corresponding to configurations described in connection with the steps in FIG. 1A. The method described in connection with FIG. 1A is an iterative method, with each iteration i being associated with an instant $t_i$ referred to as the current instant. The method consists in establishing a control signal $S_c$, comprising a succession of modulation sequences $M(t_i)$. Each modulation sequence $M(t_i)$ is parameterized by a low level low($t_i$) and a high level high($t_i$), these levels being associated with the current instant $t_i$. In the course of each sequence, the control signal comprises:

a low state, during which the control signal is maintained at the low level low($t_i$);

a high state, in which the control signal is maintained at the high level high($t_i$).

Switching between a low state and a high state forms a transition. Such a transition is considered fast enough to be neglected. Thus, in the course of each modulation sequence, the control signal essentially oscillates between two discrete values, respectively corresponding to the high and low levels. The term essentially refers to the transitions approximately between the high state and a low state or vice versa.

According to one variant, there are only two levels, independent of the current instant, and common to each sequence: a low level, e.g. corresponding to a zero voltage, and a high level corresponding to the height of each high state. Sometimes, the modulation is of a multilevel type, the number and the value of the levels corresponding to predetermined data. An example of three-level modulation is given in EP0336019.

The main steps of the embodiment shown diagrammatically in FIG. 1A are now described. These steps are implemented at different current instants, each current instant $t_i$ being incremented between two successive iterations, between an initial instant $t_0$ and a final instant $t_f$.

Step 100: taking account of a reference signal $S_{ref}$. The reference signal $S_{ref}$ corresponds to the signal with respect to which the modulation is performed. This involves an input datum of the method.

Step 110: calculating a time derivative of the reference signal at the current instant $t_i$, or at an instant sufficiently close to the current instant so that the time derivative may be associated with the modulation sequence $M(t_i)$ corresponding to the current instant. Since the reference signal is generally sampled over time, the derivative $S'_{ref}(t_i)$ corresponds to a rate of change, i.e. a difference of the reference signal between two instants, e.g. the instant $t_i + \delta t$ and the current instant $t_i$, said difference being normalized by a difference $\delta t$ between these instants.

Step 120: determining the sign of the derivative of the reference signal $S'_{ref}(t_i)$ at the current instant $t_i$. An important aspect of the method is that each modulation sequence $M(t_i)$, associated with a current instant $t_i$, depends on the sign of the derivative of the reference signal $S'_{ref}(t_i)$ at the current instant $t_i$.

When the derivative $S'_{ref}(t_i)$ is positive, the modulation sequence $M(t_i)$ associated with a current instant $t_i$ is a first modulation sequence, comprising:

a low state, during which the control signal is maintained at the low level low($t_i$), during a low state duration $T_{low}(t_i)$;

a high state, during which the control signal is maintained at the high level high($t_i$), during a high state duration $T_{high}(t_i)$.

The low state extends between the start of the sequence and the high state, the latter extending up to the end of the sequence; the duration $T(t_i)$ of the sequence is such that:

$$T(t_i)=T_{low}(t_i)+T_{high}(t_i) \quad (1).$$

Figure 2A:
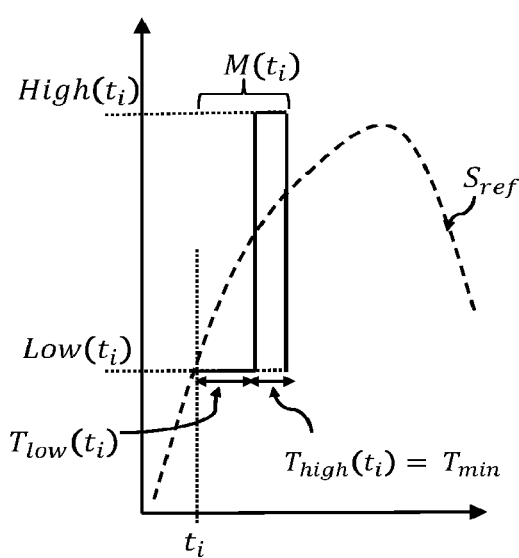
FIGS. 2A to 2F depict different modulation sequences, respectively corresponding to different situations.

FIG. 2A represents such a sequence. The parameterization of the first sequence is described in connection with steps 131, 141, 151, 161, 171 and 181.

When the derivative $S'_{ref}(t_i)$ is negative, the modulation sequence $M(t_i)$ associated with a current instant $t_i$ is a second modulation sequence, comprising:

a high state, during which the control signal is maintained at the high level high($t_i$), during a high state duration $T_{high}(t_i)$, then a low state, during which the control signal is maintained at the low level low($t_i$), during a low state duration $T_{low}(t_i)$.

The high state extends between the start of the sequence $M(t_i)$ and the low state, the latter extending up to the end of the sequence; the duration of the sequence $T(t_i)$ is such that:

$$T(t_i)=T_{high}(t_i)+T_{low}(t_i) \quad (1').$$

Figure 2B:
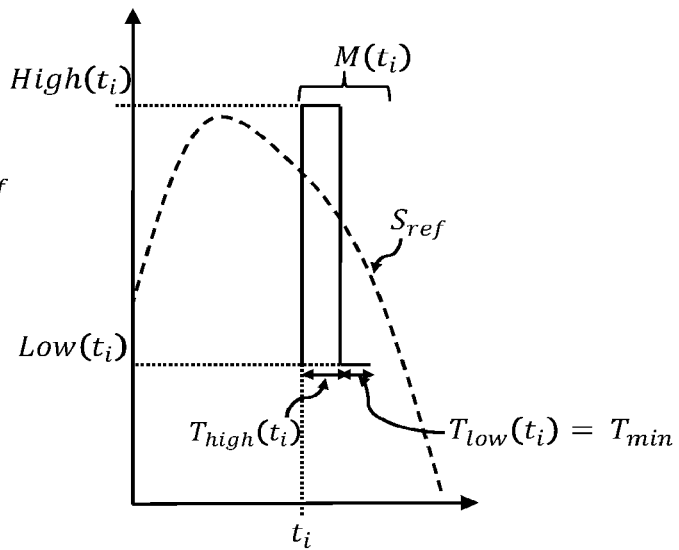

FIG. 2B represents such a sequence. The parameterization of the second sequence is described in connection with steps 132, 142, 152, 162, 172 and 182.

Whatever the sequence $M(t_i)$ taken into account, the high level high($t_i$) and the low level low($t_i$) are constant during the sequence, and determined according to previously defined values. They are defined, in each sequence, by considering the evolution of the reference signal $S_{ref}$ during the duration of the sequence $T(t_i)$. The device may comprise a calculation module, taking the discrete voltage levels into account. The levels high($t_i$) and low($t_i$) may, for example, be determined by calculating an average value $\overline{S}_{ref}(t_i)$ of the reference signal $S_{ref}(t_i)$ according to the duration $T(t_i)$ of the sequence $M(t_i)$. The levels high($t_i$) and low($t_i$) corresponding to the sequence are then preset, discrete levels, framing the average value $\overline{S}_{ref}(t_i)$. In particular they may be discrete levels immediately above and below the calculated average value respectively. The levels high($t_i$) and low($t_i$) may also be determined by taking into account the value of the reference signal $S_{ref}(t_i)$ at the current instant $t_i$. The assumption is then made that the modulation frequency is sufficiently high, with respect to the evolution of the reference signal, for the high high($t_i$) and low low($t_i$) levels to be preset discrete levels respectively on each side of the value of the reference signal $S_{ref}(t_i)$ at the current instant $t_i$. In particular they may be discrete levels immediately above and below the value of the reference signal $S_{ref}(t_i)$. respectively.

Steps 131, 141, 151, 161, 171 and 181 are now described, aimed at parameterizing the first sequence, corresponding to a positive derivative of the reference signal.

Step 131: Taking into account a minimum duration. According to this step, a minimum duration $T_{min}(t_i)$ is taken into account, associated with the current instant $t_i$; the duration of the high state is set to this minimum duration: $T_{high}(t_i)=T_{min}(t_i)$. In this example, the minimum duration $T_{min}(t_i)$ is common to each current instant $t_i$, so that for each of these instants, $T_{min}(t_i)=T_{min}$. According to other examples, the minimum duration $T_{min}(t_i)$ may be modulated according to the value of the reference signal $S_{ref}(t_i)$ or other parameters, e.g. a comparison between the high and low levels of the preceding sequence $M(t_{i-1})$ and the current sequence $M(t_i)$. Generally, the minimum duration $T_{min}(t_i)$ is greater than or equal to 5 µs or 10 µs. Taking into account a minimum duration prevents constituting a high state with too short a duration.

Step 141: Determining an additional duration $T_{comp}(t_i)$ which, added to the minimum duration $T_{min}$, forms the duration $T(t_i)$ of the sequence. In this case, the additional duration $T_{comp}(t_i)$ corresponds to the duration of the low state $T_{low}(t_i)$. The level high($t_i$) of the high state being set, the duration of the low state is determined so that the amplitude of the high state, reduced by the low level low($t_i$), integrated according to the duration $T_{min}$, corresponds to the integral of the reference signal $S_{ref}$ also reduced by the low level low($t_i$), during the duration $T(t_i)$ of the modulation sequence $M(t_i)$.

This may be expressed by the following equations:

$$\int_{t_i}^{t_i+T}(S_{ref}(k)-\text{low}(t_i))dk=(\text{high}(t_i)-\text{low}(t_i))\times T_{min} \quad (2)$$

Given that $T(t_i)=T_{min}+T_{comp}(t_i)=T_{min}+T_{low}(t_i)$ (3)

since $T_{high}(t_i)=T_{min}$

These equations form a two-equation system, the input data for which are high($t_i$), low($t_i$) and $T_{min}$ and the unknowns of which are the durations $T(t_i)$ and $T_{low}(t_i)$.

Equation (2) expresses another feature of the embodiment: in each modulation sequence $M(t_i)$, the integral of the control signal during the high state, above the low level low($t_i$), corresponds to the integral of the reference signal $S_{ref}$ above the low level low($t_i$). The integral of the control signal, during the modulation sequence, then corresponds to the integral of the reference signal.

Step 151: Validating the modulation sequence $M(t_i)$. The sequence is validated if $T_{comp}(t_i) \geq T_{min}$, i.e. if $T_{low}(t_i) \geq T_{min}$. The method then proceeds to step 171. Otherwise, the modulation sequence is invalidated and parameterized according to step 161.

Step 161: re-parameterizing the modulation sequence. In the course of this step, the sequence is parameterized so that the duration of the low state $T_{low}(t_i)$ is set to the minimum duration $T_{min}$. It is then necessary to determine an additional duration $T_{comp}(t_i)$, as defined in step 131, here corresponding to the duration $T_{high}(t_i)$ of the high state. The latter is calculated so that the integral of the high state, above the low level low($t_i$), corresponds to the integral of the reference signal $S_{ref}$, above the low level, during the sequence. See FIG. 2C. This results in the following expressions:

$$\int_{t_i}^{t_i+T}(S_{ref}(k)-\text{low}(t_i))dk=(\text{high}(t_i)-\text{low}(t_i))\times T_{high}(t_i) \quad (4)$$

and $T(t_i)=T_{min}+T_{comp}(t_i)=T_{min}+T_{high}(t_i)$ (5).

These equations form a two-equation system, the input data for which are high($t_i$), low($t_i$) and $T_{min}$ and the unknowns of which are the durations $T(t_i)$ and $T_{high}(t_i)$.

Step 171: Detecting a stopping instant. The modulation sequence being parameterized, either following step 141, or following step 161, step 171 comprises detecting, in the course of the duration $T(t_i)$ of the sequence, a particular instant $t_a$, called stopping instant, corresponding to at least one of the following conditions:

the reference signal $S_{ref}$ changes sign on each side of $t_a$;
the derivative $S'_{ref}$ of the reference signal changes sign on each side of $t_a$;
the reference signal $S_{ref}$ is periodic and reaches the end of a period at the stopping instant;

the reference signal $S_{ref}$ reaches a high level high($t_i$) or a low level low($t_i$).

When the sequence $M(t_i)$ does not comprise a stopping instant ($t_a \notin M(t_i)$), it is validated and proceeds to the reiteration step 190. When such a stopping instant $t_a$ is detected, the current sequence $M(t_i)$ is invalidated and step 181 is activated.

Step 181: correcting a preceding modulation sequence. In this step, following the invalidation of the current sequence $M(t_i)$, the modulation sequence $M(t_{i-1})$, parameterized at the modulation instant $t_{i-1}$, preceding the current instant $t_i$, is modified, so that it extends up to the stopping instant $t_a$, and it is such that the integral of the high state high($t_{i-1}$) reduced by the low level tow($t_{i-1}$), corresponds to the integral of the reference signal $S_{ref}$, reduced by the low level low($t_{i-1}$), between the instant $t_{i-1}$ and the stopping instant $t_a$.

Figure 2C:
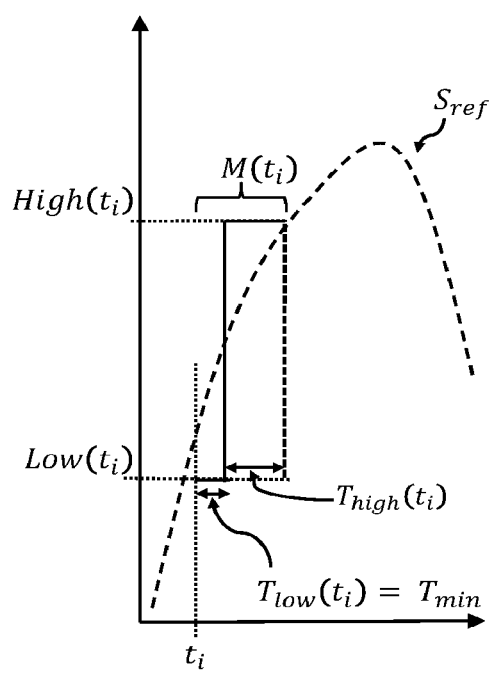
Figure 2D:
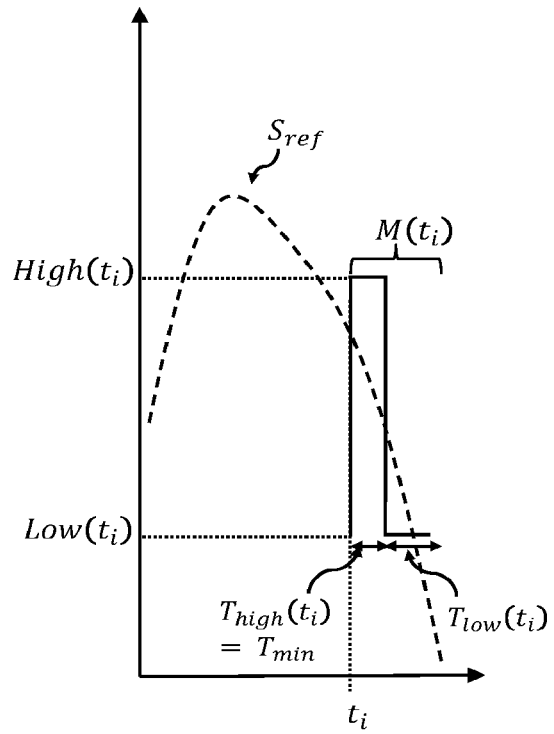
Figure 2E:
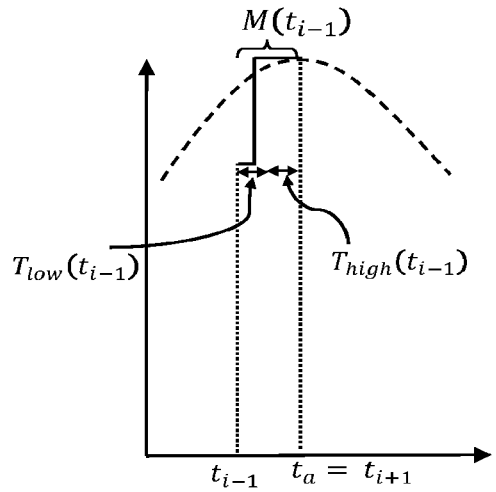

Since there has not been any sign change of the derivative of the reference signal until the stopping instant, the preceding sequence $M(t_{i-1})$ is a first sequence, in the sense that it comprises a low state followed by a high state. As can be seen in FIG. 2E, the high state is then extended up to the stopping instant, and its duration $T_{high}(t_{i-1})$ is such that:

$$\int_{t_{i-1}}^{t_a}(S_{ref}(k)\text{-low}(t_{i-1}))dk=(\text{high}(t_{i-1})\text{-low}(t_{i-1}))\times T_{high}(t_{i-1}) \quad (6)$$

$$\text{and } T(t_{i-1})=t_a-(t_{i-1})=T_{low}(t_{i-1})+T_{high}(t_{i-1}) \quad (7)$$

Such a correction is only applied for the iterations following the first iteration (i=1), for which there is no preceding iteration. It is further noted that such a correction makes it possible to meet the condition $T_{high}(t_{i-1}) \geq T_{min}$ and $T_{low}(t_{i-1}) \geq T_{min}$.

Steps 132, 142, 152, 162, 172 and 182 are now described aimed at parameterizing the second sequence. Reference is made to FIG. 2B.

Step 132: Taking into account a minimum duration. According to this step, a minimum duration $T_{min}(t_i)$ is taken into account, associated with the current instant $t_i$; the duration of the low state is set to this minimum duration: $T_{low}(t_i)=T_{min}(t_i)$. In this example, as seen in connection with step 131, the minimum duration $T_{min}(t_i)$ is common to each current instant $t_i$, so that for each of these instants, $T_{min}(t_i)=T_{min}$.

Step 142: Determining an additional duration $T_{comp}(t_i)$, as defined in step 141, and here corresponding to the duration $T_{high}(t_i)$ of the high state. The high level high($t_i$) of the high state being set, the duration $T_{high}(t_i)$ of the high state is determined so that the amplitude of the high state, reduced by the low level low($t_i$), integrated according to the duration $T_{high}$ corresponds to the integral of the reference signal $S_{ref}$, also reduced by the low level low($t_i$), during the duration $T(t_i)$ of the modulation sequence $M(t_i)$.

This may be expressed by the following equations:

$$\int_{t_i}^{t_i+T}(S_{ref}(k)\ \text{low}(t_i))dk=(\text{high}(t_i)\text{-low}(t_i))\times T_{high}(t_i) \quad (8)$$

$$\text{Given that } T(t_i)=T_{min}+T_{comp}(t_i)=T_{min}+T_{high}(t_i) \quad (9)$$

since $T_{low}(t_i)=T_{min}$

These equations form a two-equation system, the input data for which are high($t_i$), low($t_i$) and $T_{min}$ and the unknowns of which are the durations $T(t_i)$ and $T_{high}(t_i)$.

Equation (8) expresses the fact that in each sequence, the integral of the high state, above the low level low($t_i$), corresponds to the integral of the reference signal $S_{ref}$, above the low level low($t_i$). The integral of the control signal, during the modulation sequence, then corresponds to the integral of the reference signal.

Step 152: Validating the sequence. The sequence is validated if the additional duration $T_{comp}(t_i)$ is greater than or equal to the minimum duration $T_{min}$: $T_{high}(t_i) \geq T_{min}$. The method then proceeds to step 172. Otherwise, the sequence is invalidated and parameterized according to step 162.

Step 162: re-parameterizing the modulation sequence. In the course of this step, shown diagrammatically in FIG. 2D, the sequence is parameterized so that the duration $T_{high}(t_i)$ of the high state is set to the minimum duration $T_{min}$. The additional duration $T_{comp}(t_i)$ then corresponds to the duration $T_{low}(t_i)$ of the low state: it is calculated so that the integral of the high state, above the low level low($t_i$), corresponds to the integral of the reference signal $S_{ref}$, above the low level, during the sequence. This results in the following expressions:

$$\int_{t_i}^{t_i+T}(S_{ref}(k)\text{-low}(t_i))dk=(\text{high}(t_i)\text{-low}(t_i))\times T_{min} \quad (10)$$

$$\text{and } T(t_i)=T_{min}T_{comp}(t_i)=T_{min}T_{low}(t_i) \quad (11).$$

These equations form a two-equation system, the input data for which are high($t_i$), low($t_i$) and $T_{min}$ and the unknowns of which are the durations $T(t_i)$ and $T_{low}(t_i)$.

Step 172: Detecting a stopping instant. The modulation sequence being parameterized, either following step 142, or following step 162, step 172 comprises detecting, in the course of the duration $T(t_i)$ of the sequence, a particular instant $t_a$, as defined in step 171.

When such a stopping instant $t_a$ is detected, the current sequence $M(t_i)$ is invalidated and step 182 is activated. In the absence of detecting a stopping instant, the method proceeds to step 190.

Figure 2F:
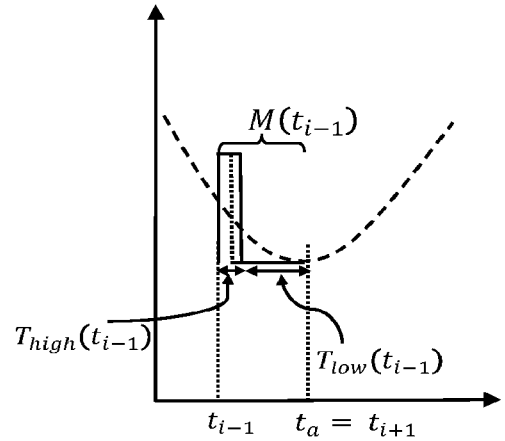

Step 182: Correcting the preceding modulation sequence. This step is represented in FIG. 2F. The modulation sequence $M(t_{i-1})$, parameterized at the modulation instant preceding the current instant, is modified so that it extends up to the stopping instant $t_a$, and it is such that the integral of the high state, reduced by the low level low($t_{i-1}$), corresponds to the integral of the reference signal $S_{ref}$ reduced by the low level low($t_{i-1}$), between the instant $t_{i-1}$ and the stopping instant.

Since there has not been any sign change of the derivative of the reference signal until the stopping instant, the preceding sequence $M(t_{i-1})$ is a second sequence, in the sense that it comprises a high state followed by a low state. The low state is then extended until the stopping instant, and the duration of the high state is such that:

$$\int_{t_{i-1}}^{t_a}(S_{ref}(k)\text{-low}(t_{i-1}))dk=(\text{high}(t_{i-1})\text{-low}(t_{i-1}))\times T_{high}(t_{i-1}) \quad (12)$$

$$\text{and } T(t_{i-1})=t_a(t_{i-1})=T_{high}(t_{i-1})+T_{low}(t_{i-1}) \quad (13)$$

Such a correction is only applied for the iterations following the first iteration (i=1), for which there is no preceding iteration. It is further noted that such a correction makes it possible to meet the condition $T_{low}(t_{i-1}) \geq T_{min}$ and $T_{high}(t_{i-1}) \geq T_{min}$.

Step 190: reiterating the current instant $t_i$. The current instant is incremented so as to correspond to the end of the resulting sequence, as in the cases of step 141, or step 161, or step 181, or step 142, or step 162, or step 182. Thus, in the absence any stopping instant detected in the course of the iteration corresponding to the current instant $t_i$, $t_{i+1}=t_i+T(t_i)$.

When a stopping instant $t_a$ has been detected in the course of the iteration corresponding to the current instant $t_i$, the following iteration starts at the stopping instant: $t_{i+1}=t_a$ Steps 110 to 190 are reiterated until a stopping criterion is reached, e.g. a number of predetermined iterations or reaching a maximum instant. The control signal $S_c$ is gradually formed by the set of sequences $M(t_i)$ respectively formed at each iteration.

The method described above offers the following advantages:
- an adaptation to the variation of the reference signal, such that when the reference signal $S_{ref}$ is increasing, the sequences are different from those established when the reference signal is decreasing. The morphology of each sequence is adapted to the variation of the reference signal: low level then high level when the reference signal is increasing; high level then low level when the reference signal is decreasing. This minimizes the average distance, during each sequence, between the control signal $S_c$, and the reference signal $S_{ref}$. The control signal is then closer to the reference signal. At the end of the sequence, the control signal may notably reach:
  - a high level, making it closer to the low level of the following sequence, when the low level $low(t_{i+1})$ of the following sequence corresponds to the high level $high(t_i)$ of the current sequence, which is represented in FIG. 2C.
  - or a low level, making it closer to the high level of the following sequence, when the high level $high(t_{i+1})$ of the following sequence corresponds to the low level $low(t_i)$ of the current sequence.

This reduces the average error of the control signal $S_c$ with respect to the reference signal $S_{ref}$.
- taking into account a minimum duration $T_{min}$, affecting either the low state, or the high state, so as to limit the number of switchings between the two states. This makes it possible to limit the switching losses, resulting from too fast switching between different states. The minimum duration makes it possible to ensure a minimum time interval between two switchings. The duration of each sequence is then determined according to an "additional" duration $T_{comp}(t_i)$, being added to the minimum duration. The additional duration is determined by taking into account the integral of the reference signal $S_{ref}$ during each sequence, so that the energy of the control signal $S_c$, in each sequence, is as close as possible to the energy of the reference signal $S_{ref}$. It will be noted that in the methods of the prior art, the duty cycle is determined according to a value of the reference signal during given instants, but not according to an integral of the value of the reference signal during each modulation sequence.
- taking into account stopping instants $t_a$, representing a physical reality (end of period, zero reference signal, sign change of the derivative), and a synchronization of each sequence according to these stopping instants. For example, if a sinusoidal signal extending on either side of a zero value is considered, a stopping instant corresponds to each quarter period. The generated control signal then respects the periodic appearance of the reference signal and ensures a certain symmetry on each side of the stopping instants $t_a$.

FIG. 1B is a diagram of a device for implementing the invention. It consists of a generator 10 of the reference signal $S_{ref}$, and a processor 20, configured for implementing the steps as previously described for successively establishing the various sequences forming the control signal $S_c$. The control signal thus generated is sent to a generator of the control signal 30, the latter generating the control signal intended for a system to be controlled 40, e.g. a motor.

Figure 3A:
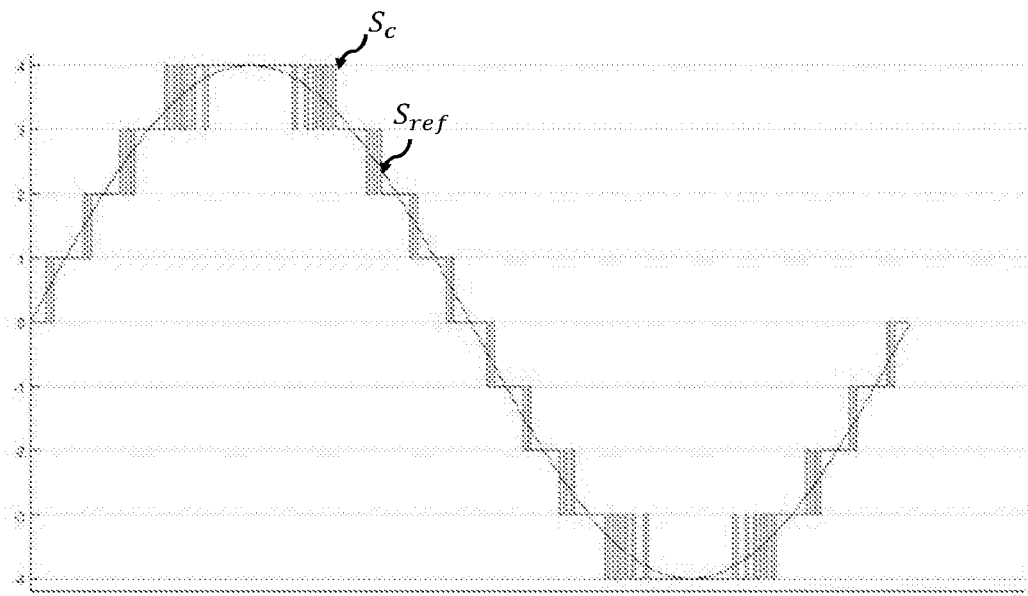
FIGS. 3A to 3D represent examples of modulation of periodic signals in implementing the invention.

FIG. 3A represents a sinusoidal reference signal $S_{ref}$, and a control signal $S_c$ comprising modulation sequences obtained by implementing the embodiment previously described, by considering a nine-level discretization. It is to be noted that the number of switchings is limited. There is also a symmetry of the control signal over a period. Thus, when the signal to be modulated is periodic, which corresponds to a normal case of application, the modulation sequences defined over a period of the reference signal $S_{ref}$ may be stored and reproduced for each period, or even a half period or a quarter period of the reference signal. This makes it possible to save on the computing and/or memory resources of the processor. The method is particularly suitable for controlling embedded systems, e.g. of vehicles, in which the processor's resources have to be optimized in order to minimize power consumption.

Figure 3B:
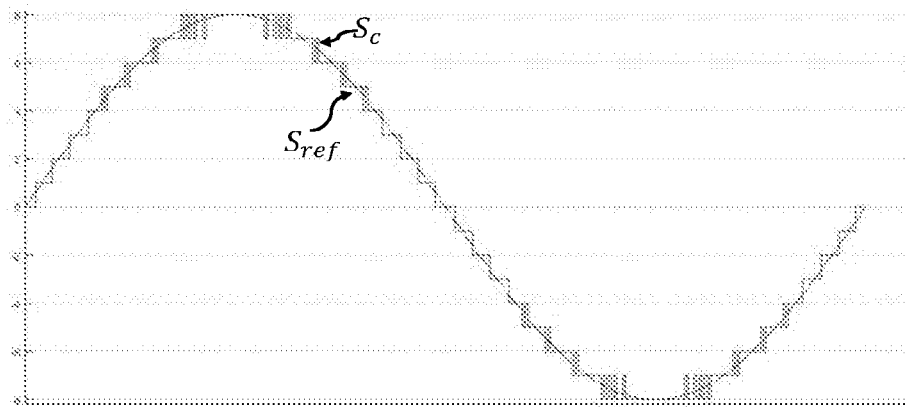
Figure 3C:
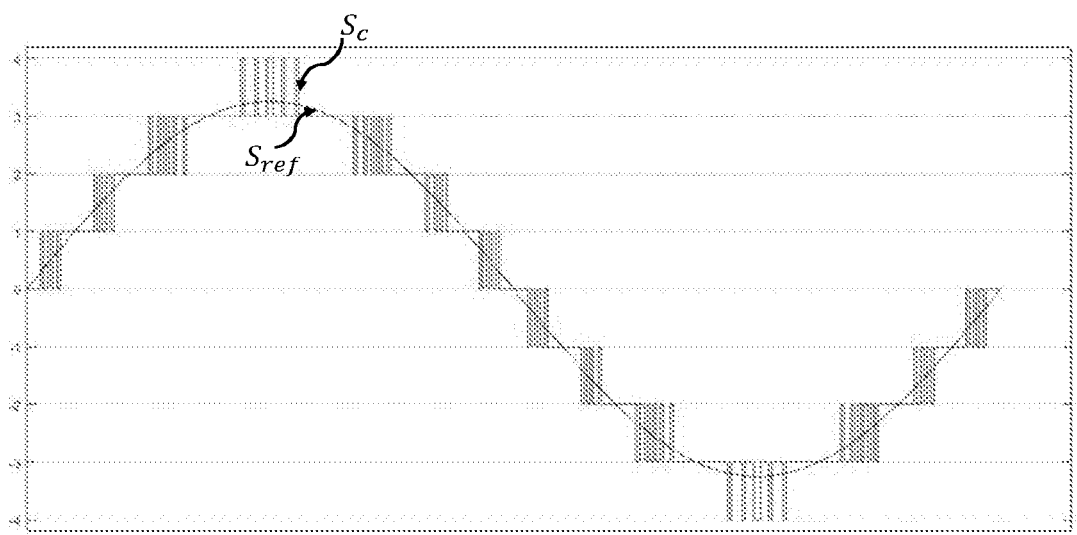

FIG. 3B represents an example of a sinusoidal signal modulation considering 17 levels. In the examples in FIG. 3A and 3B, the peak values of the reference signal correspond respectively to the minimum level (−4 in FIG. 3A, −8 in FIG. 3B) and to the maximum level (+4 in FIG. 3A, +8 in FIG. 3B). FIG. 3C represents a modulation performed on a configuration in which the peak values of the reference signal $S_{ref}$ do not coincide with level values. Again, the symmetry of the control signal may be observed.

Figure 3D:
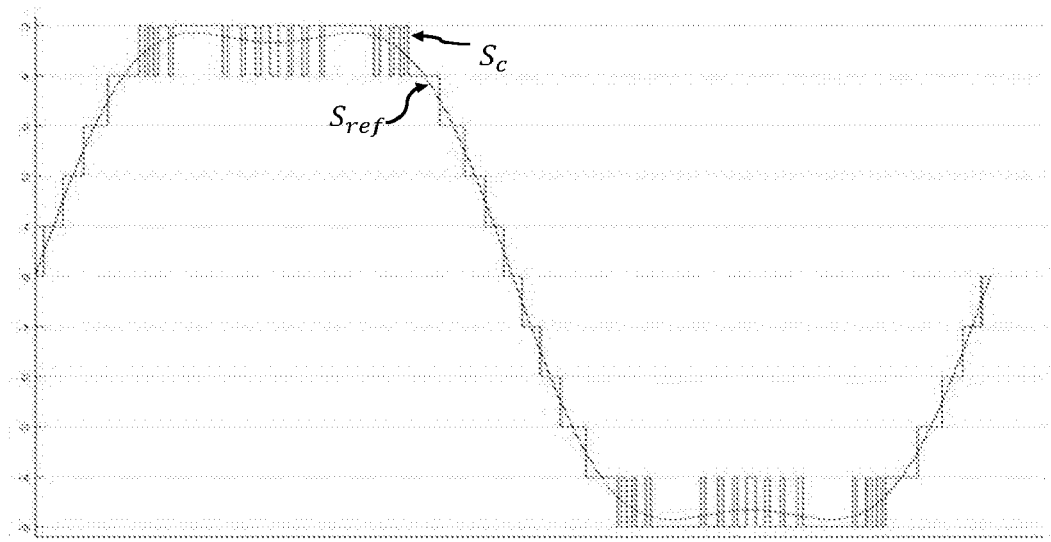

FIG. 3D shows an example of modulation of a signal comprising a main sinusoidal component completed by a harmonic component of rank 3. The harmonic component of rank 3 has a frequency three times higher than the frequency of the main component, and has an amplitude less than the latter. This illustrates the fact that the invention is applicable to complex periodic signals. This makes the invention applicable to the control of electrical machines by sinusoidal signals with harmonics injection. For example, such a configuration may be used to control one of the phases of a three-phase motor. The periodicity of the control signal makes it possible to store only the information relating to the levels and durations that have elapsed since the start of a period. A vector comprising the levels and a vector comprising the durations elapsing from the start of a period may be set up, for example. These vectors may be stored, allowing the generation of the control signal while optimizing the memory space and reducing the calculation needs, by a simple repetitive application of stored sequences.

Coupling with Hall effect sensors, arranged in the motor, makes it possible to use the information resulting from the Hall effect sensors for synchronization purposes. Indeed, a Hall effect sensor can generate a signal relating to an orientation, the generated signal having two transitions in each period. Each transition makes it possible to form a piece of angular information as to the position of the rotor with respect to the stator, allowing the synchronization of the control signal.

The inventors have carried out simulations to highlight some advantages of the invention. These simulations are presented below, in connection with FIGS. 4A to 4D.

Figure 4A:
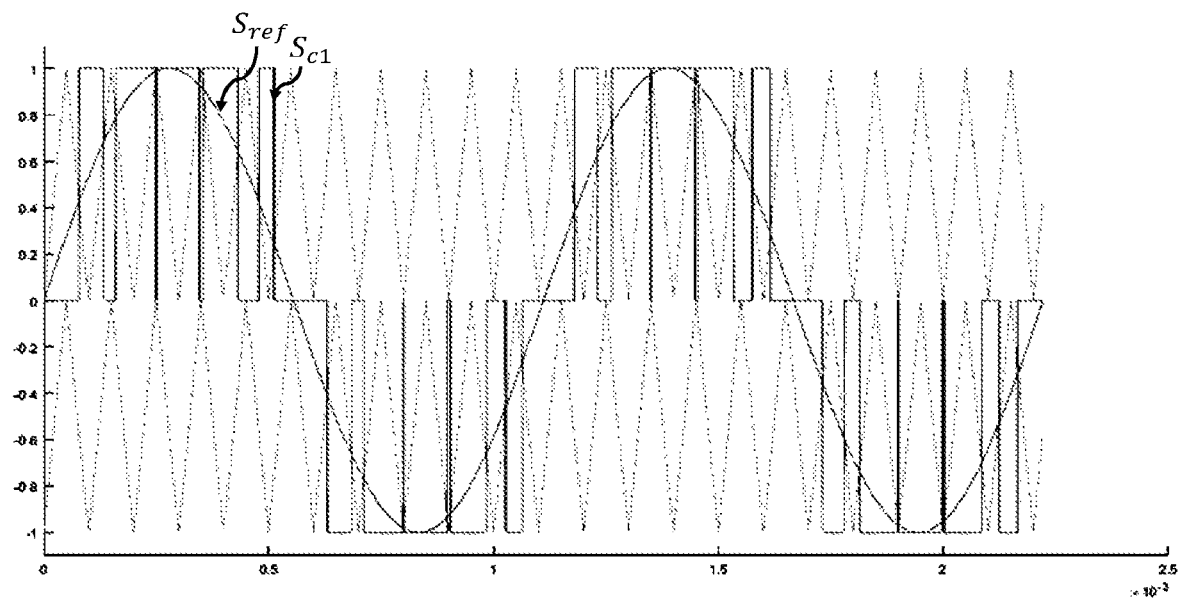
FIGS. 4A to 4D show comparative tests between a modulation of a sinusoidal signal performed according to the prior art and according to the invention.

FIG. 4A depicts a sinusoidal reference signal $S_{ref}$ and a first control signal $5_{c1}$ established according to a prior art modulation method. According to this method, a triangular carrier is applied between two successive levels, and the high and low levels of the control signal are determined according to intersections between the triangular carrier and the control signal.

Figure 4B:
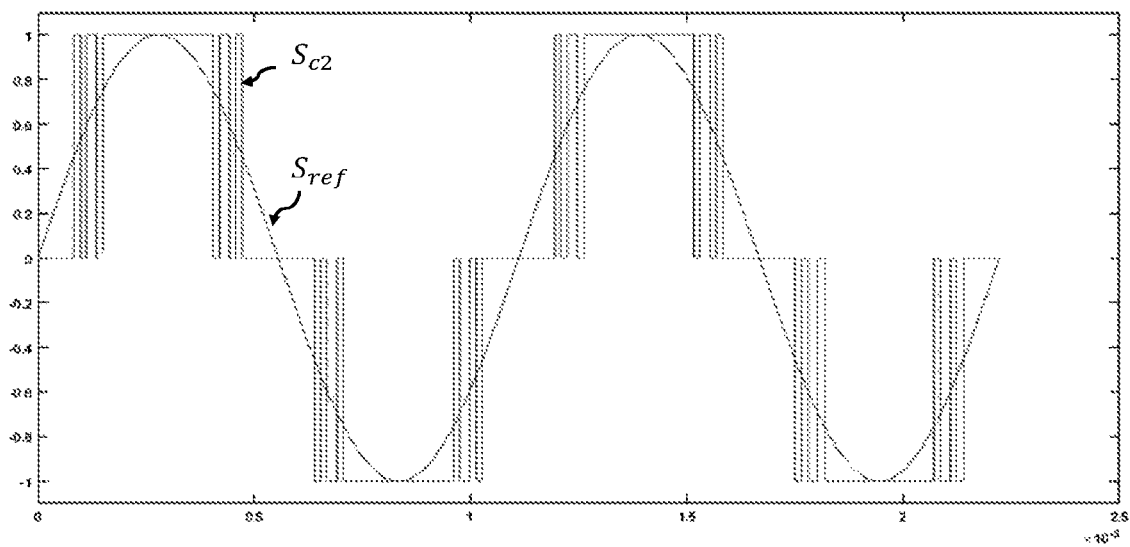

FIG. 4B represents the sinusoidal reference signal and a second control signal $S_{c2}$ obtained by implementing the method previously described. The signal $S_{c2}$ comprises the same number of switchings of the signal $S_{c1}$ By comparing FIGS. 4A and 4B, it can be seen that the second control signal $S_{c2}$ fully complies with a condition according to which the duration of each low or high state is greater than or equal to a minimum duration, which is not the case of the first control signal $S_{c1}$.

Figure 4C:
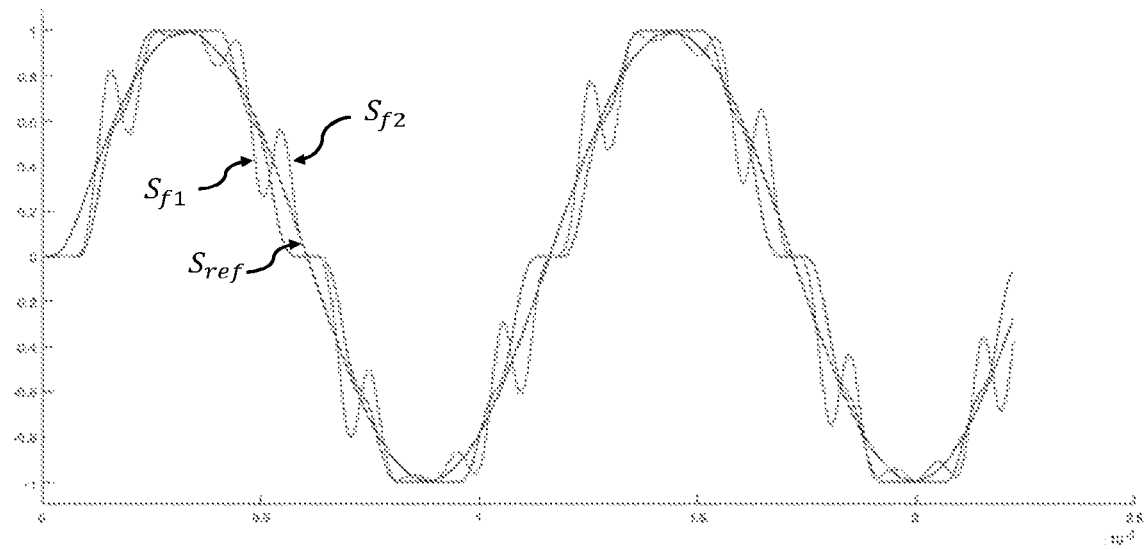

A low-pass filter has been applied to the control signals $S_{c1}$ and $S_{c2}$ respectively represented in FIGS. 4A and 4B. Thus a first filtered signal $S_{f1}$ is obtained from the control signal represented in FIG. 4A, obtained according to the prior art, and a second filtered signal $S_{f2}$, from the control signal represented in FIG. 4B, obtained according to the invention. FIG. 4C represents the first filtered signal, the second filtered signal and the reference signal. It is recalled that the modulation of the reference signal $S_{ref}$ is the more efficient the closer the control signal $S_c$, after filtering, is to the reference signal.

Figure 4D:
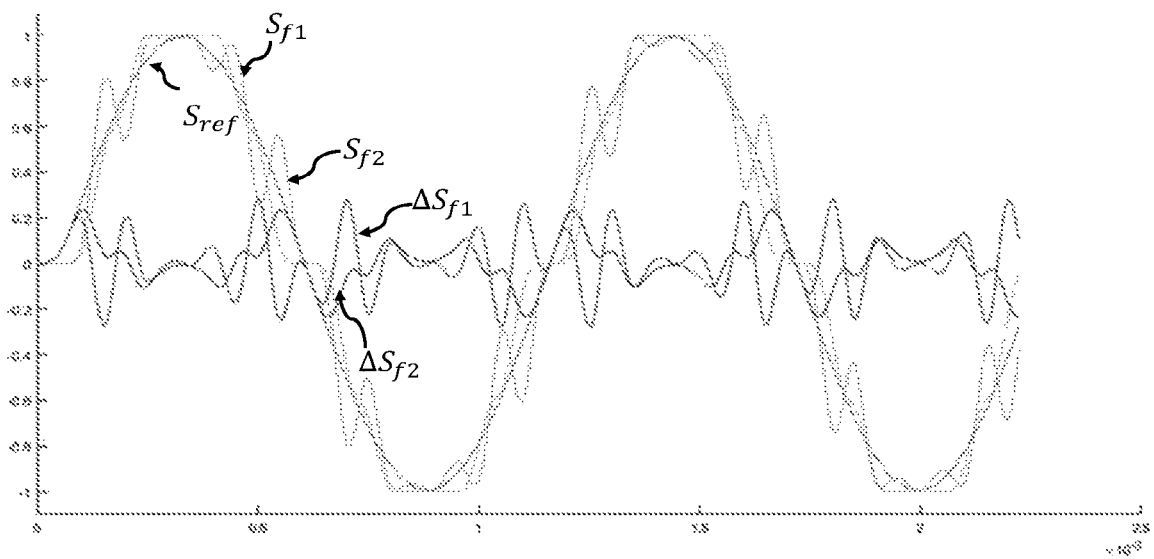

FIG. 4D depicts a first differential signal $\Delta S_{f1}$ and a second differential signal $\Delta S_{f2}$ respectively obtained by a subtraction between the reference signal and the first filtered signal, and between the reference signal and the second filtered signal: $\Delta S_{f1} = S_{ref} - S_{f1}$ and $\Delta S_{f2} = S_{ref} - S_{f2}$. The differential signal makes it possible to visually observe the performance of each modulation. It is found that the amplitude of the second differential signal is less than the amplitude of the first differential signal, which is a testament to the superior performance of the modulation performed by the invention. The inventors have calculated that in this example, the implementation of the invention leads to a reduction in the mean square error $\Delta(MSE)$ of 27.37%, this error being calculated according to the expression $$\Delta(MSE) = \left(1 - \frac{MSE(S_{c2})}{MSE(S_{c1})}\right) \times 100$$

With:

$$MSE(S_{c1}) = \frac{1}{n}\sum_{i=1}^{n}(S_{ref_i} - S_{c1_i})^2$$

and $$MSE(S_{c2}) = \frac{1}{n}\sum_{i=1}^{n}(S_{ref_i} - S_{c2_i})^2$$

n being an integer designating each sample taken into account for calculating the mean.

The invention may be applied to the electrical power supply of power systems, e.g. motors, or the exchange of energy with the electricity network. It may notably be applied on electric vehicles, such as cars or bicycles or stationary storage systems.

The invention claimed is:

1. Method for generating a control signal by pulse modulation according to a reference signal, the method comprising forming successive modulation sequences, each sequence comprising a transition between a low state and a high state or vice versa, the method comprising the following iterations, each iteration being associated with a current instant:
   a) calculating a time derivative of the reference signal, the time derivative being associated with a current modulation sequence corresponding to the current instant;
   b) according to the time derivative of the reference signal calculated in a), defining the current sequence, such that:
      when the derivative is positive, the current sequence comprises a high state preceded by a low state, the high state extending up to the end of the current sequence;
      when the derivative is negative, the current sequence comprises a high state followed by a low state, the low state extending up to the end of the current sequence;
      the low state and the high state extending over a low state duration and a high state duration respectively, the current sequence extending from the current instant, over a sequence duration;
   c) taking into account a high level, corresponding to the high state, and a low level, corresponding to the low state, the high level being strictly greater than the low level;
   d) according to the amplitude of the reference signal and the high and low levels taken into account in c), determining the duration of the high state or the duration of the low state of the current sequence defined in step b);
   e) reiterating steps a) to e), by incrementing the current instant by a duration equal to the duration of the sequence resulting from d), or stopping the iterations;
   the method further comprising:
   generating the control signal, according to the modulation sequences defined in steps d) of the different iterations.

2. The method according to claim 1, wherein d) comprises taking into account a minimum duration, and:
   di) according to the sequence defined in b), and the amplitude of the reference signal during the sequence duration, calculating an additional duration, the additional duration corresponding to:
      the duration of the low state when the derivative of the reference signal is positive, the duration of the high state then being set to the minimum duration;
      the duration of the high state when the derivative of the reference signal is negative, the duration of the low state then being set to the minimum duration;
   dii) comparing the additional duration and the minimal duration;
   diii) when the additional duration is less than the minimum duration, invalidating the additional duration resulting from di), and determining an additional duration corresponding to:
      the duration of the high state, when the derivative of the reference signal is positive, the duration of the low state then being set to the minimum duration;
      or the duration of the low state, when the derivative of the reference signal is negative, the duration of the high state then being set to the minimum duration.

3. The method according to claim 2, wherein in di), the additional duration is calculated according to an integral of the reference signal during the sequence duration and the high level taken into account in c).

4. The method according to claim 3, wherein in d), the additional duration is calculated so that the integral of the reference signal, reduced by the low level, during the sequence duration, is equal, within a predetermined tolerance, to a product of the high level, reduced by the low level, by the high state duration.

5. The method according to claim 1, comprising:
   div) determining the presence of a stopping instant, corresponding to an instant characteristic of the reference signal or of its time derivative, during the current sequence;

dv) when a stopping instant is detected, cancelling the current sequence, and adjusting a preceding sequence, defined in a preceding iteration, so that the preceding sequence extends between a preceding instant and the stopping instant.

6. The method according to claim 5, wherein the preceding sequence is adjusted so that:

when, at the preceding instant, the time derivative of the reference signal is positive, the high state of the preceding sequence extends up to the stopping instant;

when at the preceding instant, the time derivative of the reference signal is negative, the low state of the preceding sequence extends up to the stopping instant.

7. The method according to claim 5, wherein the stopping instant corresponds:

to an instant whereat the reference signal changes sign;

or to an instant whereat the derivative of the reference signal changes sign;

or the reference signal being periodic, to an instant corresponding to the end of a period of the reference signal;

or to an instant whereat the reference signal reaches the high level or the low level.

8. The method according to claim 1, wherein in b), the defined sequence comprises only one high state and only one low state.

9. The method according to claim 1, wherein in c), determining the high level and the low level is performed according to predetermined values, and according to the reference signal during a duration of a pulse.

10. A Device for generating a control signal, according to a reference signal, the device comprising a processor capable of implementing steps a) to e) of a method according to claim 1, according to the reference signal.

* * * * *